United States Patent [19]

Miyashita et al.

[11] Patent Number: 5,380,399
[45] Date of Patent: Jan. 10, 1995

[54] METHOD OF TREATING SEMICONDUCTOR SUBSTRATES

[75] Inventors: Naoto Miyashita; Koichi Takahashi, both of Yokohama; Mitsutoshi Koyama, Koganei, all of Japan

[73] Assignee: Kabushiki Kaisha Toshiba, Kawasaki, Japan

[21] Appl. No.: 120,436

[22] Filed: Sep. 14, 1993

[30] Foreign Application Priority Data

Sep. 14, 1992 [JP] Japan .................................. 4-270901

[51] Int. Cl.⁶ ...................... H01L 21/306; B44C 1/22; C03C 15/00
[52] U.S. Cl. ...................................... 156/646; 156/657; 156/662; 437/233; 437/241; 437/248
[58] Field of Search ............... 156/646, 653, 657, 345, 156/662; 437/225, 228, 233, 241, 247, 248, 238

[56] References Cited

U.S. PATENT DOCUMENTS 4,981,811 6/1991 Feygenson et al. .................. 437/46

Primary Examiner—William Powell
Attorney, Agent, or Firm—Foley & Lardner

[57] ABSTRACT

To heat treat a semiconductor substrate without forming an oxide film on the surface thereof, the method of heat treating a semiconductor substrate, comprises: a step 1 of carrying a semiconductor substrate into a heat treating chamber heated at a temperature 150° C. or lower; a step 2 of heating the heat treating chamber up to about 200° C. to emit moisture adhering to the semiconductor substrate; a step 3 of introducing an etching gas into the heat treating chamber to etch an oxide film formed on the surface of the semiconductor substrate; and a step 4 of raising the temperature within the heat treating chamber up to a heat treating temperature to heat treat the semiconductor substrate.

30 Claims, 7 Drawing Sheets

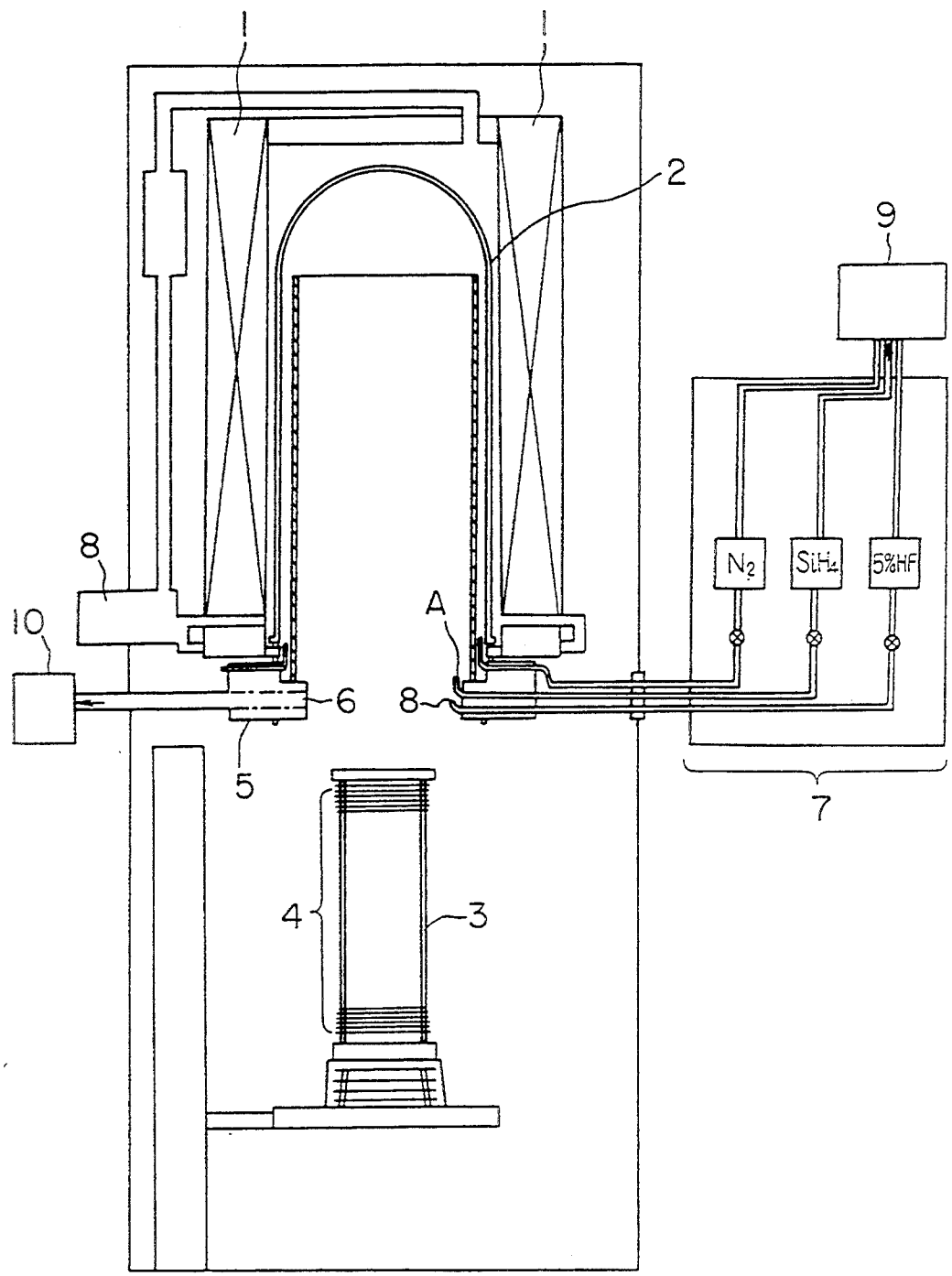
F I G. 1

(CONVENTIONAL METHOD)

(INVENTION METHOD)

METHOD OF TREATING SEMICONDUCTOR SUBSTRATES

FIELD OF THE INVENTION

The present invention relates to a method of treating semiconductor substrates, and more specifically to such a semiconductor substrate treating method that an oxide film can be prevented from growing on the surface of each of the semiconductor substrates or removed therefrom, when the semiconductor substrates are put into and out of a heat treating apparatus or when heat-treated within the heat treating apparatus.

BACKGROUND OF THE INVENTION

In general, there are well known some mechanisms for preventing an oxide film from being formed on the surface of each of the semiconductor substrates whenever the semiconductor substrates are put into and out of a heat treating apparatus. For example, a substrate space through which the semiconductor substrates are put into and out of the heat treating apparatus is isolated from an external air and further evacuated into a vacuum, before the semiconductor substrates are put into and out of the heat treating apparatus. As a result, it is possible to prevent an oxide film from growing on the surface of each of the semiconductor substrates.

In the above-mentioned conventional method, although the growth of an oxide film on the surface of each of the semiconductor substrates due to the external air can be suppressed, it is impossible to suppress the growth of an oxide film due to moisture absorbed in the semiconductor substrate naturally. In addition, it is impossible to remove an oxide film formed between when an oxide film on each of the semiconductor substrates has been removed and when the semiconductor substrates are put into the heat treating apparatus.

SUMMARY OF THE INVENTION

With these problems in mind, therefore, the object of the present invention is to provide a method of heat treating semiconductor substrates by which the semiconductor substrates can be heat treated under the condition that no oxide film is formed on the surface of each of the semiconductor substrates.

To achieve the above-mentioned object, the present invention provides a method of heat treating a semiconductor substrate, comprising: a step 1 of carrying a semiconductor substrate into a heat treating chamber heated at a temperature 150° C. or lower; a step 2 of heating the heat treating chamber up to about 200° C. to emit moisture adhering to the semiconductor substrate; a step 3 of introducing an etching gas into the heat treating chamber to etch an oxide film formed on the surface of the semiconductor substrate; and a step 4 of raising the temperature within the heat treating chamber up to a heat treating temperature to heat treat the semiconductor substrate.

In the step 3, the oxide film is etched by use of a hydrogen fluoride gas including minute moisture as the etching gas. The method of heat treating the semiconductor substrate according to the present invention further comprises a step 5A of introducing a gas including silicon to form a poly silicon layer on the surface of the semiconductor substrate, after the step 4 or a step 5B of introducing a gas including silicon and nitrogen to form a nitride film layer on the surface of the semiconductor substrate, after the step 4.

In the treating method of the semiconductor substrates according to the present invention, the semiconductor substrates are put into a heat treating chamber of relatively low temperature, with the result that it is possible to suppress the growth of an oxide film on the surface of each of the semiconductor substrates. Thereafter, the heat treating chamber is kept at a relatively high temperature for a constant time to remove moisture from the semiconductor substrates. Further, an etching gas is introduced into the heat treating chamber to remove the oxide film growing on the surface of each of the semiconductor substrates. Thereafter, the heat treating chamber is kept at a high temperature for heat treatment.

BRIEF DESCRIPTION OF THE DRAWINGS

FIG. 1 is a diagrammatical view showing a heat treating apparatus, by which a first embodiment of the method of treating the semiconductor substrates according to the present invention can be effected;

DETAILED DESCRIPTION OF THE PREFERRED EMBODIMENTS

Figure 2:
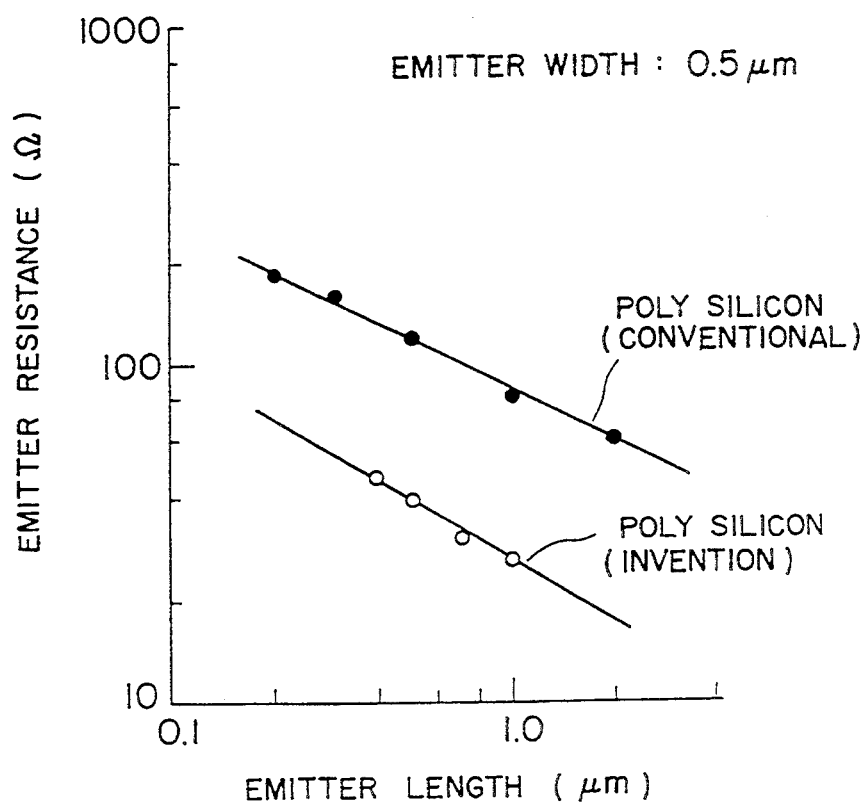
FIG. 2 is a graphical representation showing the relationship between the emitter size and the emitter resistance of a npn transistor heat treated by the semiconductor substrate treating method of the present invention, in comparison with that treated by the conventional semiconductor substrate treating method.

The embodiment of the present invention will be described hereinbelow with reference to the attached drawings. FIG. 1 shows a heat treating apparatus for effecting the method of treating semiconductor substrates according to the present invention. By this heat treating apparatus, a poly silicon layer can be formed on each of the semiconductor substrates under reduced pressure.

In FIG. 1, the heat treating apparatus comprises a heater 1, a reaction tube 2, a semiconductor substrate holding boat 3, a doping unit 7, a forced air cooling apparatus 8, a cylinder cabinet 9, an vacuum pump 10, etc. The reaction tube (a heat treating section) 2 is enclosed by the heater 1. A plurality of semiconductor substrates 4 are mounted on the semiconductor substrate holding boat 3, and then inserted into the reaction tube 2 for heat treatment, to form a poly silicon layer on the surface of each of the semiconductor substrates. The forced air cooling apparatus 8 is attached to reduce the temperature within the reaction tube 2 at a rate of about 10° C. per min or more, in the case where the heat treating temperature is determined to be about 500° C. or lower, for instance. That is, the cooling apparatus 8 passes cool air forcedly through between the heater 1 and the reaction tube 2, to cool the inside of the reaction tube 2. On the other hand, the reaction tube 2 is formed with a flange portion 5. The flange portion 5 is formed with a gas outlet port 6. The gas outlet port 6 is connected to the vacuum pump 10 to evacuate the inside of the reaction tube 2 into a vacuum.

On the other hand, the doping unit 7 is connected to the cylinder cabinet 9. The doping unit 7 prepares gases such as $N_2$, $SiH_4$, about 5% HF, etc. and supplies these prepared treating gasses into the reaction tube 2 through a silane gas nozzle A and a hydrogen fluoride gas nozzle B, respectively. That is, after the semiconductor substrates 4 have been inserted into the reaction tube 2, a hydrogen fluoride gas including a very small amount of moisture (e.g., about 3000 ppm or less) is prepared by the doping unit 7 and then supplied into the reaction tube 2 through the hydrogen fluoride gas nozzle B, to remove an oxide film adhered onto each of the semiconductor substrates 4.

The operation of the heat treating apparatus as shown in FIG. 1 will be described hereinbelow.

First, the heater 1 is activated to heat the internal temperature of the reaction tube 2 up to between about 100° and about 150° C., for example, about 100° C. Thereafter, the semiconductor substrates 4 mounted on the semiconductor substrate boat 3 are inserted into the reaction tube 2. Then, the inside of the reaction tube 2 is evacuated through the gas outlet port 6 formed in the flange portion 5 of the reaction tube 2 down to a vacuum of 1 mm Torr. Further, the internal temperature of the reaction tube 2 is raised up to between about 100° and about 850° C., for example about 200° C. at a heating rate of about 20° C. per min. The internal temperature (about 200° C.) of the reaction tube 2 is kept for between about 10 and about 60 min, for example, about 30 min to release moisture absorbed onto the surfaces of the semiconductor substrates 4. Thereafter, the forced air cooling apparatus 8 is actuated to cool the internal temperature of the reaction tube 2 down to about 50° C. at a cooling rate of about 15° C. per min. Further, between a few and 10%, for example, about 5% HF (about 5% hydrogen fluoride gas having nitrogen as a base gas) containing between a few and about 10,000 ppm, for example, about 2000 ppm moisture is introduced from the doping unit 7 into the reaction tube 7 through the hydrogen fluoride gas nozzle B, to remove an oxide films formed on each of the semiconductor substrates 4. Further, the inside of the reaction tube 2 is evacuated again down to 1 mm Torr, and then heated up to about 625° C. at a rate of about 20° C. per min. After the internal temperature of the reaction tube 2 is stabilized at this temperature about 625° C., $SiH_4$ (silane gas) of about 130$_{sccm}$ is passed from the doping unit 7 into the reaction tube 2 through the silane gas nozzle A, to form a poly silicon film on each of the semiconductor substrates 4. The inside of the reaction tube 2 is cooled again by the forced cooling apparatus 8 down to about 100° C. at a cooling rate of about 15° C. per min. Thereafter, the semiconductor substrates 4 are taken out of the reaction tube 2, to complete the heat treatment of the semiconductor substrates 4.

Figure 3:
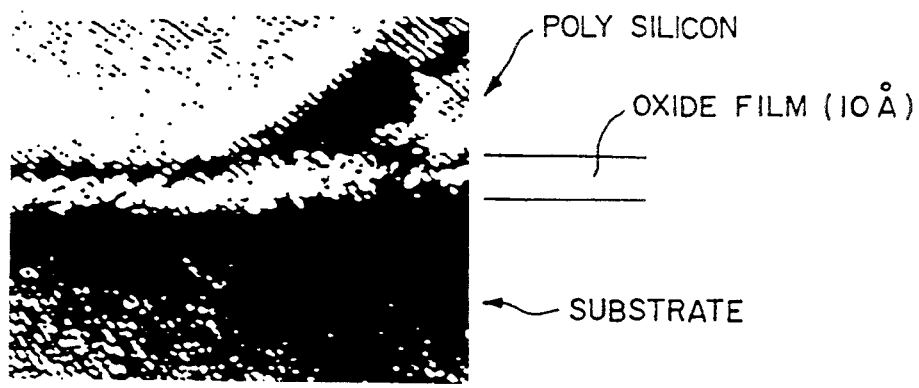
FIG. 3, 5 and 7 are cross-sectional photographs each showing a metallurgical structure of the emitter region of an npn transistor formed on the semiconductor substrate in accordance with the conventional heat treating method, which is taken by a transmission-type electron microscope of high resolving power.
Figure 4:
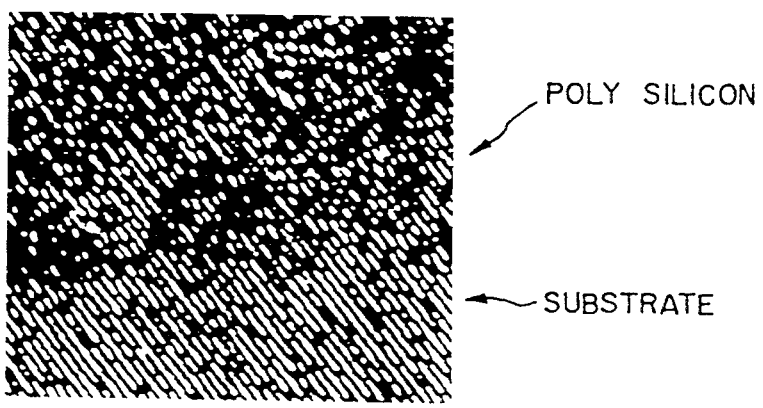
FIG. 4, 6 and 8 are cross-sectional photographs each showing a metallurgical structure of the emitter region of the same npn transistor formed on the semiconductor substrate in accordance with the method according to the present invention, which is taken by the same transmission-type electron microscope of high resolving power.
Figure 5:
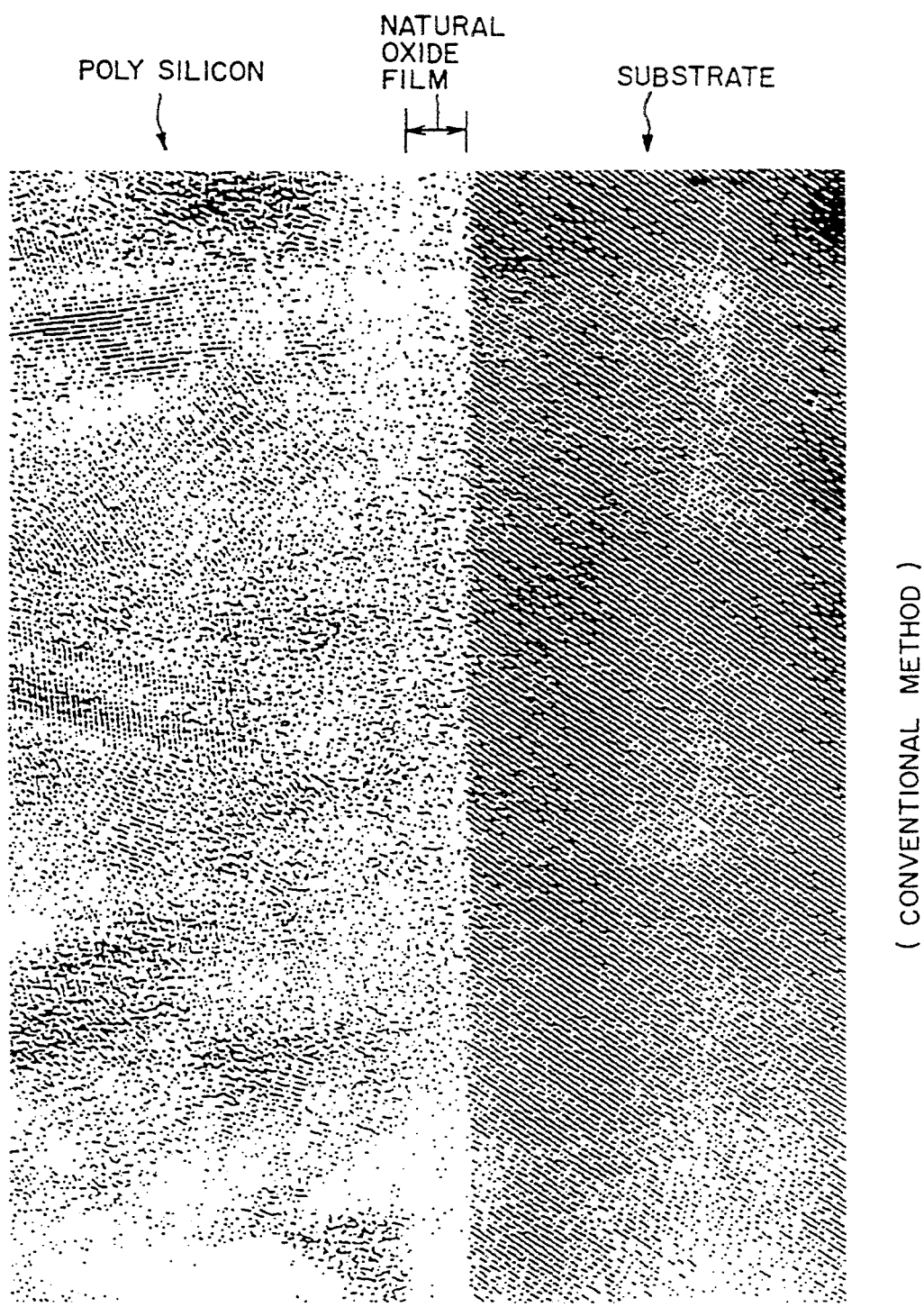
Figure 6:
Figure 7:
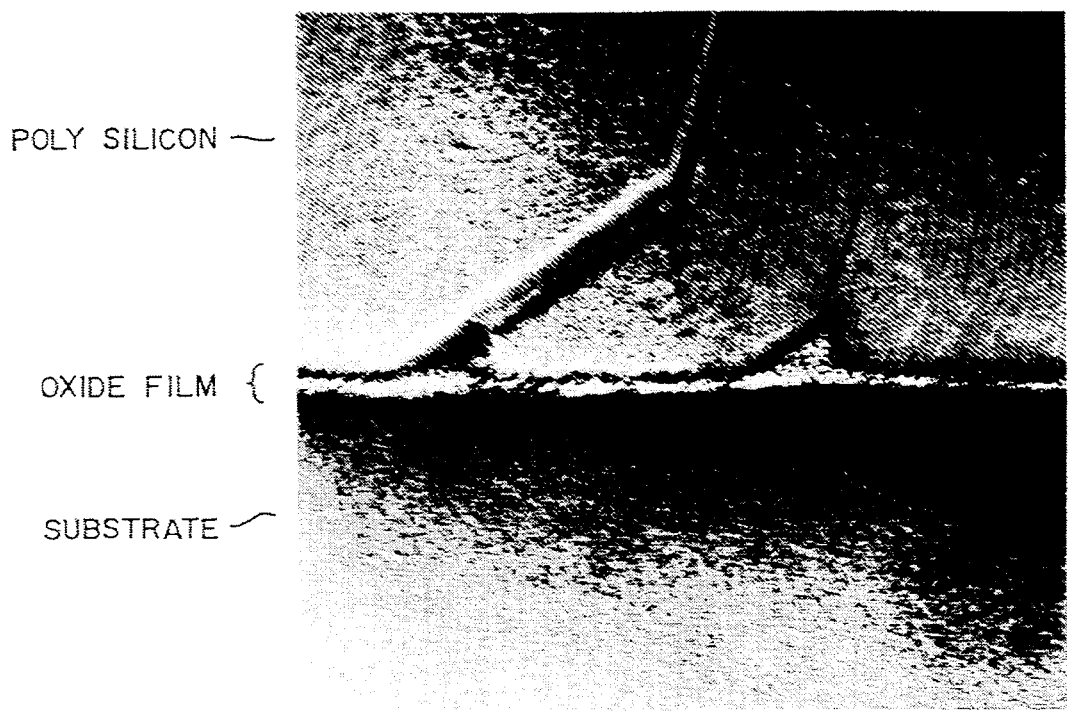
Figure 8:
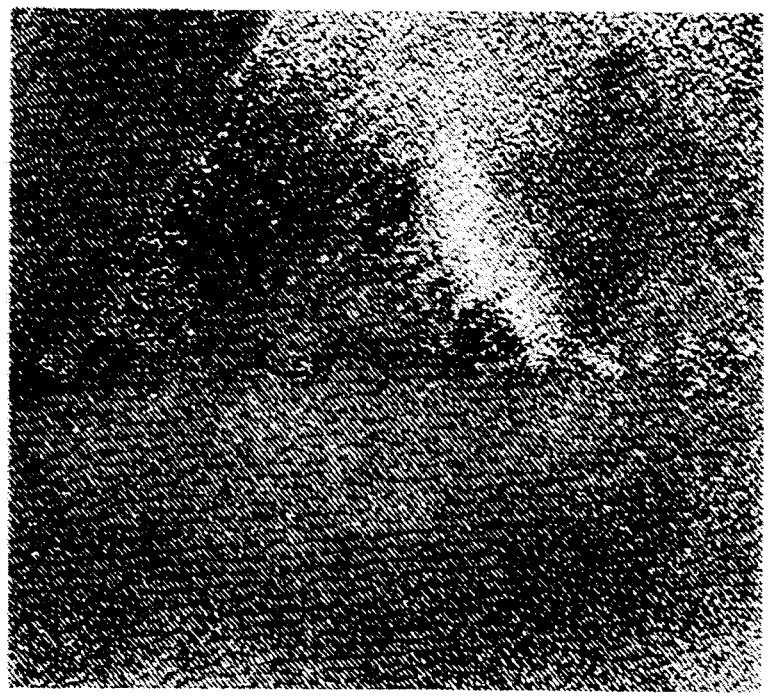

Into the poly silicon film formed on each of the semiconductor substrates 4 treated as described above, As ions are injected at a dose of $1.2 \times 10^{16}$ cm$^{-12}$ and at an acceleration voltage of 50 keV, to form an emitter region having an emitter resistance of an npn transistor. FIG. 2 shows the relationship between the emitter size and the emitter resistance of the npn transistor thus formed, in comparison with a pnp transistor formed in accordance with the conventional treating method, in which the abscissa designates the emitter length ($\mu$m), the ordinate designates the emitter resistance ($\Omega$), and the emitter width is kept at a constant value of 0.5 $\mu$m. Where the emitter region is formed by the use of the poly silicon film formed in accordance with the method of the present invention, FIG. 2 indicates that it is possible to reduce the emitter resistance down to about $\frac{1}{3}$ of that of the conventional transistor, under the condition that the emitter length is 2 $\mu$m. Further, FIGS. 3, 5 and 7 show cross-sectional views of the emitter region in the poly silicon layer formed in accordance with the conventional method, and FIGS. 4, 6 and 8 show cross-sectional views of the emitter region in the poly silicon layer formed in accordance with the method of the present invention, all of which are photographs taken by a transmission-type electron microscope of high resolving power. FIGS. 3, 5 and 7 (conventional) indicate that there exists an oxide film region with a thickness of about 10 Å (angstroms) in the interface between the poly silicon layer and the semiconductor substrate, and FIGS. 4, 6 and 8 (invention) indicate that there exists no oxide film in the interface between the poly silicon layer and the semiconductor substrate.

Further, in the treating method of the present invention, it is possible to form a nitride film by passing a silane gas and ammonia gas (including nitrogen), instead of the silane gas.

As explained above, where a poly silicon layer or a nitride film layer is formed in accordance with the treating method of the present invention, it is possible to eliminate the oxide film formed under the poly silicon layer, with the result that a device with a lower emitter resistance can be formed.

As described above, in the treating method of the present invention, it is possible to suppress the growth of the oxide film and further to remove the oxide film growing on the semiconductor substrate in a relatively short time, so that it is possible to obtain high performance semiconductor substrates at higher productivity.

What is claimed is:

1. A method of heat treating a semiconductor substrate, comprising:
   step 1 of carrying a semiconductor substrate into a heat treating chamber heated at a temperature of about 150° C. or lower;
   step 2 of heating the heat treating chamber up to about 200° C. to remove moisture adhering to the semiconductor substrate;
   step 3 of introducing an etching gas into the heat treating chamber to etch an oxide film formed on the surface of the semiconductor substrate; and
   step 4 of raising the temperature within the heat treating chamber up to a heat treating temperature to heat treat the semiconductor substrate.

2. The method of heat treating a semiconductor substrate according to claim 1, wherein in step 3, the oxide film is etched by use of a hydrogen fluoride gas containing trace amount of moisture as the etching gas.

3. The method of heat treating a semiconductor substrate according to claim 1, which further comprises, after step 4, a step 5A of introducing a gas containing silicon to form a poly silicon layer on the surface of the semiconductor substrate.

4. The method of heat treating a semiconductor substrate according to claim 2, which further comprises, after step 4, a step 5A of introducing a gas containing silicon to form a poly silicon layer on the surface of the semiconductor substrate.

5. The method of heat treating a semiconductor substrate according to claim 1, which further comprises, after step 4, step 5B of introducing a gas containing silicon and nitrogen to form a nitride film layer on the surface of the semiconductor substrate.

6. The method of heat treating a semiconductor substrate according to claim 2, which further comprises, after step 4, step 5B of introducing a gas containing silicon and nitrogen to form a nitride film layer on the surface of the semiconductor substrate.

7. The method of heat treating a semiconductor substrate according to claim 3, wherein the etching gas used in step 3 is a hydrogen fluoride gas containing about 2000 ppm moisture and about 5% nitrogen as a base gas.

8. The method of heat treating a semiconductor substrate according to claim 4, wherein the etching gas used in step 3 is a hydrogen fluoride gas containing about 2000 ppm moisture and about 5% nitrogen as a base gas.

9. The method of heat treating a semiconductor substrate according to claim 5, wherein the etching gas used in step 3 is a hydrogen fluoride gas containing about 2000 ppm moisture and about 5% nitrogen as a base gas.

10. The method of heat treating a semiconductor substrate according to claim 6, wherein the etching gas used in step 3 is a hydrogen fluoride gas containing about 2000 ppm moisture and about 5% nitrogen as a base gas.

11. The method of heat treating a semiconductor substrate according to claim 7, wherein, in step 3, the temperature in the heat treating chamber is lowered to about 50° C. before the etching gas is introduced into the heat treating chamber.

12. The method of heat treating a semiconductor substrate according to claim 8, wherein, in step 3, the temperature in the heat treating chamber is lowered to about 50° C. before the etching gas is introduced into the heat treating chamber.

13. The method of heat treating a semiconductor substrate according to claim 9, wherein, in step 3, the temperature in the heat treating chamber is lowered to about 50° C. before the etching gas is introduced into the heat treating chamber.

14. The method of heat treating a semiconductor substrate according to claim 10, wherein, in step 3, the temperature in the heat treating chamber is lowered to about 50° C. before the etching gas is introduced into the heat treating chamber.

15. The method of heat treating a semiconductor substrate according to claim 11, wherein, in step 2, the heat treating chamber is substantially evacuated to a vacuum before the temperature of the heat treating chamber is raised.

16. The method of heat treating a semiconductor substrate according to claim 12, wherein, in step 2, the heat treating chamber is substantially evacuated to a vacuum before the temperature of the heat treating chamber is raised.

17. The method of heat treating a semiconductor substrate according to claim 13, wherein, in step 2, the heat treating chamber is substantially evacuated to a vacuum before the temperature of the heat treating chamber is raised.

18. The method of heat treating a semiconductor substrate according to claim 14, wherein, in step 2, the heat treating chamber is substantially evacuated to a vacuum before the temperature of the heat treating chamber is raised.

19. The method of heat treating a semiconductor substrate according to claim 15, wherein, in step 2, the heat treating chamber is kept at approximately 200° C. for about 30 min.

20. The method of heat treating a semiconductor substrate according to claim 16, wherein, in step 2, the heat treating chamber is kept at approximately 200° C. for about 30 min.

21. The method of heat treating a semiconductor substrate according to claim 17, wherein, in step 2, the heat treating chamber is kept at approximately 200° C. for about 30 min.

22. The method of heat treating a semiconductor substrate according to claim 18, wherein, in step 2, the heat treating chamber is kept at approximately 200° C. for about 30 min.

23. The method of heat treating a semiconductor substrate according to claim 19, wherein, in step 4, the heat treating chamber is evacuated substantially to a vacuum before the temperature of the heat treating chamber is raised to the heat treating temperature.

24. The method of heat treating a semiconductor substrate according to claim 20, wherein, in step 4, the heat treating chamber is evacuated substantially to a vacuum, before the temperature of the heat treating chamber is raised to the heat treating temperature.

25. The method of heat treating a semiconductor substrate according to claim 21, wherein, in step 4, the heat treating chamber is evacuated substantially to a vacuum, before the temperature of the heat treating chamber is raised to the heat treating temperature.

26. The method of heat treating a semiconductor substrate according to claim 22, wherein, in step 4, the heat treating chamber is evacuated substantially to a vacuum, before the temperature of the heat treating chamber is raised to the heat treating temperature.

27. The method of heat treating a semiconductor substrate according to claim 23, wherein the heating rate in the heat treating chamber is about 20° C. per min and the cooling rate therein is about 15° C. per min.

28. The method of heat treating a semiconductor substrate according to claim 24, wherein the heating rate in the heat treating chamber is about 20° C. per min and the cooling rate therein is about 15° C. per min.

29. The method of heat treating a semiconductor substrate according to claim 25, wherein the heating rate in the heat treating chamber is about 20° C. per min and the cooling rate therein is about 15° C. per min.

30. The method of heat treating a semiconductor substrate according to claim 26, wherein the heating rate in the heat treating chamber is about 20° C. per min and the cooling rate therein is about 15° C. per min.

* * * * *